(12) United States Patent
Engl et al.

(10) Patent No.: US 8,526,476 B2
(45) Date of Patent: Sep. 3, 2013

(54) SEMICONDUCTOR CHIP AND METHOD FOR MANUFACTURING A SEMICONDUCTOR CHIP

(75) Inventors: Karl Engl, Regensburg (DE); Lutz Hoeppel, Alteglofsheim (DE); Christoph Eichler, Tegernheim (DE); Matthias Sabathil, Regensburg (DE); Andreas Weimar, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 203 days.

(21) Appl. No.: 12/598,747

(22) PCT Filed: Apr. 24, 2008

(86) PCT No.: PCT/DE2008/000703
§ 371 (c)(1),
(2), (4) Date: Jan. 7, 2010

(87) PCT Pub. No.: WO2008/135013
PCT Pub. Date: Nov. 13, 2008

(65) Prior Publication Data
US 2010/0208763 A1    Aug. 19, 2010

(30) Foreign Application Priority Data

May 4, 2007 (DE) .......................... 10 2007 021 389
Jun. 26, 2007 (DE) .......................... 10 2007 029 370

(51) Int. Cl.
*H01S 5/00* (2006.01)
(52) U.S. Cl.
USPC ...................... 372/46.01; 257/98; 372/46.012

(58) Field of Classification Search
USPC ............... 372/46.012, 46.01, 46.011, 46.013; 257/91, 98
See application file for complete search history.

(56) References Cited

U.S. PATENT DOCUMENTS

| 6,838,704 | B2 * | 1/2005 | Lin et al. ........................ 257/98 |
| 6,900,068 | B2 * | 5/2005 | Lin et al. ........................ 438/29 |
| 7,283,577 | B2 | 10/2007 | Schmid et al. |
| 7,446,341 | B2 | 11/2008 | Bader et al. |
| 7,989,820 | B2 * | 8/2011 | Lee ................... 257/79 |
| 8,017,963 | B2 * | 9/2011 | Donofrio et al. ................ 257/98 |
| 8,269,250 | B2 * | 9/2012 | Jeong .............................. 257/99 |

(Continued)

FOREIGN PATENT DOCUMENTS

| DE | 102 44 986 A1 | 4/2004 |
| EP | 1 662 584 A2 | 5/2006 |

(Continued)

OTHER PUBLICATIONS

Schnitzer, I., et al., "30% External Quantum Efficiency from Surface Textured, Thin-Film Light-Emitting Diodes", Applied Physics Letters, Oct. 18, 1993, pp. 2174-2176, vol. 63, No. 16.

*Primary Examiner* — Jessica Stultz
*Assistant Examiner* — Joshua King
(74) *Attorney, Agent, or Firm* — Slater & Matsil, L.L.P.

(57) ABSTRACT

A semiconductor chip with a semiconductor body has a semiconductor layer sequence with an active region provided for generating radiation. A mirror structure that includes a mirror layer and a dielectric layer that is arranged at least in regions between the mirror layer and semiconductor body is arranged on the semiconductor body.

17 Claims, 8 Drawing Sheets

(56) References Cited

U.S. PATENT DOCUMENTS

| | | |
|---|---|---|
| 2003/0111667 A1* | 6/2003 | Schubert .......................... 257/98 |
| 2003/0141506 A1* | 7/2003 | Sano et al. ....................... 257/78 |
| 2004/0119085 A1* | 6/2004 | Bader et al. ...................... 257/98 |
| 2004/0135166 A1* | 7/2004 | Yamada et al. ............... 257/103 |
| 2005/0279990 A1 | 12/2005 | Liu et al. |
| 2006/0289886 A1 | 12/2006 | Sakai |
| 2007/0012937 A1 | 1/2007 | Liu et al. |
| 2007/0018184 A1* | 1/2007 | Beeson et al. ................... 257/98 |
| 2007/0081571 A1 | 4/2007 | Wirth |
| 2008/0197369 A1* | 8/2008 | Batres et al. .................... 257/98 |
| 2009/0026478 A1* | 1/2009 | Yoon et al. ...................... 257/98 |

FOREIGN PATENT DOCUMENTS

| | | |
|---|---|---|
| EP | 1 770 792 A2 | 4/2007 |
| JP | 2007-67198 | 3/2007 |
| WO | WO 2006/062300 A1 | 6/2006 |

* cited by examiner

SEMICONDUCTOR CHIP AND METHOD FOR MANUFACTURING A SEMICONDUCTOR CHIP

This patent application is a national phase filing under section 371 of PCT/DE2008/000703, filed Apr. 24, 2008, which claims the priority of German patent applications 10 2007 021 389.3, filed May 4, 2007 and 10 2007 029 370.6 filed Jun. 26, 2007, each of which is incorporated herein by reference in its entirety.

TECHNICAL FIELD

The invention relates to a semiconductor chip and method for manufacturing a semiconductor chip.

BACKGROUND

LED semiconductor chips often have a high internal quantum efficiency. This indicates the portion of electron-hole pairs that recombine in the active region, emitting radiation in the form of photons. However, the radiation produced usually does not completely exit the semiconductor chip, but due to total reflection, for example, is instead partially reflected back into the semiconductor chip at a boundary surface and absorbed. The more photons generated in the semiconductor chip lost due to absorption of the usable radiation exiting the semiconductor chip, the lower the outcoupling efficiency of the semiconductor chip becomes.

SUMMARY

A first aspect of the present invention specifies a semiconductor chip in which the outcoupling efficiency in operation of the semiconductor chip is increased. In addition, a method with which a semiconductor chip with increased outcoupling efficiency may be produced in a simplified manner is specified.

According to an embodiment, a semiconductor chip has a semiconductor body that includes a semiconductor layer sequence with an active region provided to generate radiation. A mirror structure is arranged on the semiconductor body. The mirror structure includes a mirror layer and a dielectric layer structure that is arranged, at least in regions, between the mirror layer and the semiconductor body.

Radiation generated in the active region during operation of the semiconductor chip may be reflected back into the semiconductor body by the mirror structure. In that way, an absorption of radiation in regions of the semiconductor chip arranged on the other side of the mirror structure as viewed from the active region may be avoided. Subsequently the radiation may exit from the semiconductor chip. Thereby the outcoupling efficiency of the semiconductor chip may be increased.

The mirror layer preferably contains a metal or a metal alloy. For example, the mirror layer may contain gold, silver, aluminum, rhodium, platinum, titanium or palladium, or may consist of such a material. A metal alloy with at least one of these metals may also be used.

In an embodiment, the dielectric layer structure contains exactly one dielectric layer. Such a dielectric layer structure is distinguished particularly by easy manufacturability.

In an alternative embodiment, the dielectric layer structure includes a plurality of dielectric layers. A dielectric mirror structure may be formed by means of the dielectric layers. In particular, the dielectric mirror structure may be configured as a Bragg mirror. High reflectivities for radiation generated in the active region may be achieved with such a dielectric mirror structure.

Radiation that strikes the dielectric layer structure at an angle in which the reflectivity of the dielectric layer structure is comparatively low may pass through the dielectric layer structure and subsequently be reflected at the mirror layer. The reflectivity of the mirror layer, preferably metallic or based on a metal alloy, has a comparatively low dependence on the angle of incidence, particularly in comparison to the dielectric mirror structure. Thus a particularly high proportion of the radiation striking the mirror structure may be reflected therefrom due to the combination of the dielectric layer structure with the mirror layer. The reflectivity of the mirror structure for radiation generated in the active region may be 80% or more, preferably 90% or more, and especially preferably 95% or more.

At least one layer of the dielectric layer structure preferably contains an oxide, such as $SiO_2$, a nitride, such as $Si_3N_4$, or an oxynitride, such as SiON.

The semiconductor body may have a side face that bounds the semiconductor body, particularly the active region, in a lateral direction. A lateral direction in this regard is understood to be a direction that runs along a main extension direction of the layers of the semiconductor layer sequence. The side face preferably runs perpendicular or at an angle to the main extension direction of the layers of the semiconductor layer sequence.

In a preferred configuration, the mirror structure, the dielectric layer structure in particular, runs at least in regions up to the side face of the semiconductor body that bounds the semiconductor body. In particular, the mirror structure may extend in the lateral direction over the entire periphery of the semiconductor body up to the side face, or optionally, further side faces, each bounding the semiconductor body.

At least in regions, the mirror structure, in particular the dielectric layer structure, may extend in the lateral direction, particularly in a flat configuration, beyond the side face bounding the semiconductor body. It is further preferred that the side face bounding the semiconductor body be free of material for the dielectric layer structure.

At least in regions, the mirror layer may also extend in the lateral direction, particularly in a flat configuration, beyond the side face bounding the semiconductor body.

In a preferred configuration, a contact structure is arranged on the semiconductor body. The contact structure may be arranged on the same side of the semiconductor body as the dielectric layer structure. The contact structure serves for external electrical contacting of the semiconductor body.

It is further preferred that the semiconductor chip have a further contact structure. In particular, the further contact structure may be arranged on the semiconductor body on the side of the active region facing away from the contact structure. In the operation of the semiconductor chip, charge carriers may be injected into the semiconductor body by means of these contact structures.

The semiconductor chip preferably includes a radiation exit surface that extends in the lateral direction. The mirror structure, in particular the dielectric layer structure, is preferably arranged on the side of the active region facing away from the radiation exit surface. Radiation generated in the active region and emitted in the direction of the mirror layer may be reflected by means of the dielectric layer structure in the direction of the radiation exit surface and ultimately exit from this radiation exit surface.

In another preferred configuration, the semiconductor chip has a carrier on which the semiconductor body is arranged.

The carrier is thus a part of the semiconductor chip and serves in particular, for the mechanical stabilization of the semiconductor body. In addition, the carrier may be different from a growth substrate for the semiconductor layer sequence. The carrier, therefore, need not meet the crystallinity requirements for a growth substrate, but may instead be selected in view of other physical properties, such as a high thermal conductivity or a high mechanical stability. For example, the carrier may contain silicon, silicon carbide, germanium, gallium arsenide, gallium nitride, gallium phosphide or some other semiconductor material, or consist of such a material. The electrical conductivity of such a carrier may be increased by means of doping, for example. An electrically insulating carrier, such as a carrier containing aluminum nitride or sapphire, or consisting of such a material, may also be used. The carrier may be fixed to the semiconductor body by means of a connecting layer. The connecting layer may contain a solder or an adhesive, for example.

Alternatively, the carrier may be formed by means of a layer that is deposited on the semiconductor body. In this case, the layer is sufficiently thick to stabilize the semiconductor body mechanically. The carrier may be formed, for example, by means of a metal layer or a layer based on a metal alloy.

The carrier is preferably arranged on the side of the semiconductor body facing away from the radiation exit surface. In addition, the mirror structure is preferably arranged between the carrier and the semiconductor body. Radiation generated in the active region and emitted in the direction of the carrier may thus be reflected at the mirror structure in the direction of the radiation exit surface and may ultimately exit from this radiation exit surface.

In a preferred refinement, the carrier projects from the semiconductor chip, at least in regions, in a plan view onto the semiconductor chip. In this case, the mirror structure, particularly the dielectric layer structure, may project past the side face of the semiconductor body up to carrier side face that bounds the carrier. The mirror structure, particularly the dielectric layer structure, may thus extend parallel to the carrier beyond the side face of the semiconductor chip. Thus, even radiation exiting via the side face of the semiconductor chip in the direction of the carrier may be reflected by the mirror structure. Radiation generated in the active region may be prevented from being absorbed in the carrier in a very efficient manner.

In a preferred configuration, the contact structure is formed by means of the mirror layer. The mirror layer may thus serve both for electrical contacting of the semiconductor body and as a mirror coating of the dielectric layer structure. The mirror layer here may extend completely or only in regions over a surface of the semiconductor body, preferably facing the carrier.

In a preferred refinement, the dielectric layer structure has at least one cutout. The contact structure may be formed in this at least one cutout in the dielectric layer structure. In addition, the dielectric layer structure may be divided into at least two separate subregions by the cutout. The cutout may thus be formed between the separate subregions. For example, the dielectric layer structure may include an inner subregion and an outer subregion, wherein the outer subregion may run completely around the inner subregion in the lateral direction. In this case, the outer subregion may be constructed in the manner of a frame.

In another preferred configuration, the dielectric layer structure and the contact structure are arranged side by side, at least in regions. In the operation of the semiconductor chip, charge carriers are injected by means of these contact structures into the semiconductor body in a region of the semiconductor body adjoining the contact structure. On the other hand, no charge carriers are injected at points of the semiconductor body that adjoin the dielectric layer structure. By means of the dielectric layer structure, at least one region of the surface of the semiconductor body in the lateral direction may be defined, via which no charge carriers are injected into the semiconductor body during operation of the semiconductor chip.

For example, the dielectric layer structure, particularly the inner subregion of the dielectric layer structure as seen in a plan view onto the semiconductor chip, may overlap a region of the radiation exit surface that is shaded by, for example, the further contact structure. The further contact structure and the dielectric layer structure may overlap as seen in a plan view onto the semiconductor chip. The lateral shaping of the inner subregion of the dielectric layer structure may be matched to the shape of the further contact structure. The portion of the radiation that is generated below the further contact structure and absorbed by it may thus be reduced.

The dielectric layer structure may further be constructed laterally in such a manner, possibly by a frame-like formation of the dielectric layer structure or the outer subregion of the dielectric layer structure, that the injection of charge carriers is reduced in the peripheral region of the semiconductor body, i.e., close to the side face of the semiconductor body. In this manner, the non-radiating recombination of charge carriers may be reduced.

In another preferred configuration, the dielectric layer structure is arranged continuously between the mirror layer and the semiconductor body.

Preferably, the mirror layer further includes a cutout, with the cutout of the mirror layer overlapping the cutout of the dielectric layer structure. In this case, the contact structure and the mirror layer may be formed with a distance between them.

The contact structure and/or the further contact structure may be formed with multiple layers. In particular, at least one layer of the contact structure or the further contact structure may contain a TCO (transparent conductive oxide) material. A layer containing a TCO material preferably adjoins the semiconductor body.

TCO materials are transparent conductive materials, generally metal oxides such as zinc oxide, tin oxide, cadmium oxide, titanium oxide, indium oxide or indium-tin oxide (ITO). In addition to binary metal-oxygen compounds such as $ZnO$, $SnO_2$ or $In_2O_3$, ternary metal-oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent electrically conductive oxides belong to the group of transparent electrically conductive oxides. Furthermore, the transparent conductive oxides need not necessarily correspond to a stoichiometric composition. The TCOs may also be p-doped or n-doped.

The contact structure may further include a reflector layer. The reflector layer is preferably arranged closer to the semiconductor body than is the mirror layer. The reflector layer may adjoin the semiconductor body. Alternatively, the layer containing TCO material in the contact structure may be arranged between the reflector layer and the semiconductor body.

Accordingly, the further contact structure may include a further reflector layer. The further reflector layer is preferably arranged between the semiconductor body and a connection layer of the further contact structure. The connection layer is provided for external electrical contacting of the semiconductor chip, by means of a bond wire for example.

Radiation generated in the active region of the semiconductor chip during operation of the semiconductor chip may be reflected back into the semiconductor body at the reflector layer or the further reflector layer. In that way, an absorption of radiation in a layer of the contact structure or of the further contact structure arranged behind the reflector layer or the further reflector layer, respectively, as viewed from the active region may be avoided or at least reduced.

In particular, the reflector layer and/or the further reflector layer may contain a metal or a metal alloy. For example, gold, silver, aluminum, rhodium, platinum, titanium, palladium or an alloy with at least one of these materials is suitable.

Particularly for the case where the reflector layer and/or the further reflector layer adjoins the semiconductor body, the reflector layer or the further reflector layer has, in addition to a high reflectivity for the radiation generated in the active region, good electrical contact properties with the semiconductor body as well.

In case the reflector layer and/or the further reflector layer is spaced apart from the semiconductor body, the reflector layer and/or the further reflector layer may, like the mirror layer, be constructed predominantly for an optimally high reflectivity for radiation generated in the active region.

The mirror layer may be formed on the side of the reflector layer facing away from the semiconductor body. In this case, the mirror layer may extend over the reflector layer completely or only in regions.

In a preferred configuration, the semiconductor body includes a tunnel contact layer, preferably adjoining the contact structure or the further contact structure. The tunnel contact layer is preferably strongly p-doped or strongly n-doped. The tunnel contact layer additionally has a different conductivity type than another semiconductor layer arranged between the active region and the contact structure or the further contact structure. During operation of the semiconductor chip, charge carriers may be injected into the semiconductor body in a simplified manner by means of the tunnel contact layer.

In another preferred configuration, the surface of the semiconductor body in which the further contact structure is arranged is flat in the vertical direction in a region adjoining the further contact structure. In this region, the surface of the semiconductor body is preferably smoothed. The lower the roughness of this surface region, the better the reflectivity of the contact structure.

It is further preferable that the surface have a structuring in a further region adjoining the flat region. The structuring is provided to increase the outcoupling efficiency of radiation generated in the active region. The structuring may be regularly or irregularly formed.

An irregular structuring may be produced, for example, by a roughening of the surface. Alternatively, the structuring may be regular, for example, in the form of a microprism or a photonic lattice. In a photonic lattice, the period length of the lateral structuring, i.e., the length in which the lateral structuring is periodically repeated, is in the vicinity of the wavelength of the radiation produced in the active region, roughly between 0.1 times and 10 times this wavelength in the material in which the photonic lattice is formed.

In another preferred configuration, the growth substrate for the semiconductor layer sequence is removed at least in regions or thinned at least in regions. Such a semiconductor chip is referred to as a thin-film semiconductor chip.

A radiation-producing thin-film semiconductor chip may be distinguished by the following characteristic features in particular:

a reflecting layer that reflects at least a part of the radiation produced in the epitaxial layer sequence back into it is applied to or formed on a first main surface of a radiation-producing epitaxial layer facing a carrier element;

the epitaxial layer sequence has a thickness in the range of 20 µm or less, in particular in the range of 10 µm; and/or the epitaxial layer sequence contains at least one semiconductor layer with at least one surface having a mixing structure, which leads in the ideal case to a nearly ergodic distribution of the light in the epitaxial layer sequence, i.e., it has as ergodic a stochastic scattering behavior as possible.

A fundamental principle of a thin-film light-emitting diode chip is described, for example, in I. Schnitzer et al., Appl. Phys. Lett. 63(16), Oct. 18, 1993, 2174-2176, the disclosure of which is incorporated herein by reference.

A thin-film light-emitting diode chip is in good approximation to a Lambertian surface radiator and is, therefore, particularly suited for use in a headlight.

The semiconductor chip is preferably provided to generate predominantly incoherent radiation. For example, the semiconductor chip may be configured as an LED chip or an RCLED chip (resonant cavity light-emitting diode). In an RCLED, the active region is situated inside a cavity. Alternatively, the semiconductor chip may be provided to generate coherent radiation. In this case, the semiconductor chip may be configured as a surface-emitting semiconductor laser chip with an internal resonator (vertical cavity surface-emitting laser, VCSEL) or as a surface-emitting semiconductor laser chip with an external resonator (vertical external cavity surface-emitting laser, VECSEL).

The semiconductor body, particularly the active region, preferably contains a III-V semiconductor material. III-V semiconductor materials are particularly suited for generating radiation in the ultraviolet range ($In_xGa_yAl_{1-x-y}N$), through the visible range ($In_xGa_yAl_{1-x-y}N$, particularly for blue to green radiation, or $In_xGa_yAl_{1-x-y}P$, particularly for yellow to red radiation), and into the infrared ($In_xGa_yAl_{1-x-y}As$) spectral range. In each case here $0 \leq x \leq 1$, $0 \leq y \leq 1$ and $x+y \leq 1$, preferably with $x \neq 0$, $y \neq 0$, $x \neq 1$ and/or $y \neq 1$. With III-V semiconductor materials, particularly with the above material systems, advantageously high internal quantum efficiencies in radiation generation may also be obtained.

According to an embodiment, in a method for manufacturing a semiconductor chip with a respective semiconductor body that includes a semiconductor layer sequence with an active region provided to generate radiation, a semiconductor layer structure system with the active region is first produced. The semiconductor body with the semiconductor layer sequence originates during the manufacturing process from the semiconductor layer structure system.

A mirror structure is formed on the prefabricated semiconductor layer structure system, wherein the mirror structure includes a dielectric layer structure and a mirror layer. The semiconductor body with the semiconductor layer sequence is formed from the semiconductor layer structure system. The semiconductor chip is finished.

A semiconductor chip including a mirror structure may thus be manufactured in a simplified manner.

The semiconductor body is preferably formed from the semiconductor layer structure system after the formation of the mirror structure.

The semiconductor layer structure system is preferably provided on a growth substrate for the semiconductor layer structure system. The semiconductor layers of the semiconductor layer structure system are preferably epitaxially deposited on the growth substrate, in particular, by means of MBE or MOVPE.

In a preferred configuration, the semiconductor layer structure system is mounted on a carrier, in particular before the formation of the semiconductor layer structure system. The carrier serves particularly for the mechanical stabilization of the semiconductor body. The growth substrate is thus no longer necessary for a uniformly good mechanical stabilization. Alternatively, the carrier may be deposited on the semiconductor layer structure system. This may be done galvanically, for example, or by means of a different deposition method, such as vapor deposition or sputtering.

In a preferred embodiment, the growth substrate for the semiconductor layer structure system is removed at least in regions or thinned at least in regions. This may be done, for instance, by means of a mechanical process, such as grinding, smoothing or polishing. A chemical process, particularly an etching process, may also be used. A laser detachment process may alternatively or additionally be employed for removing the growth substrate. The growth substrate is preferably removed or thinned after the carrier has been provided.

In another preferred configuration, a contact structure is formed on the semiconductor body. A further contact structure may also be formed. The contact structure as well as the further contact structure, if any, may be formed with one layer or with multiple layers. The layer or the plurality of layers of the contact structures may be deposited, for example, by means of vapor deposition or sputtering.

In a preferred refinement, a surface of the semiconductor body is smoothed at least in regions, with the contact structure and/or the further contact structure being subsequently formed on the smoothed area of the surface. The reflectivity of the contact structure or the further contact structure may be increased in this manner. Radiation striking the contact structure or the further contact structure may thus be efficiently reflected back into the semiconductor body and subsequently exit from it.

The semiconductor body is expediently smoothed mechanically, particularly by means of grinding, lapping or polishing. Alternatively or additionally, the smoothing may be performed chemically, for example, in a wet chemical or dry chemical process.

In another preferred configuration, a surface of the semiconductor body is provided with a structuring. An area of the surface on which the contact structure or the further contact structure is formed is preferably spared in the structuring process. The structuring is provided to increase the outcoupling efficiency of the semiconductor chip. The structuring may take place before or after the formation of the semiconductor body from the semiconductor layer structure system. For example, the structuring may be produced by mechanical roughening of the surface. A structuring, particularly a regular one, possibly in the form of microprisms or in the form of a photonic crystal, may be produced, for example, chemically, in particular by means of wet chemical or dry chemical etching.

The described method for manufacturing a semiconductor chip is especially suitable for manufacturing a semiconductor chip as described above. Characteristics described in connection with the semiconductor chip may, therefore, also be used for the method and vice versa.

BRIEF DESCRIPTION OF THE DRAWINGS

Further characteristics, advantageous configurations and practical aspects of the invention follow from the description of embodiments below in conjunction with the figures.

Identical, similar and identically functioning elements are provided with the same reference numbers.

The figures are schematic representations in each case and are, therefore, not necessarily true to scale. Instead, relatively small elements and, in particular, layer thicknesses may be represented exaggeratedly large for clarification.

DETAILED DESCRIPTION OF ILLUSTRATIVE EMBODIMENTS

Figure 1A:
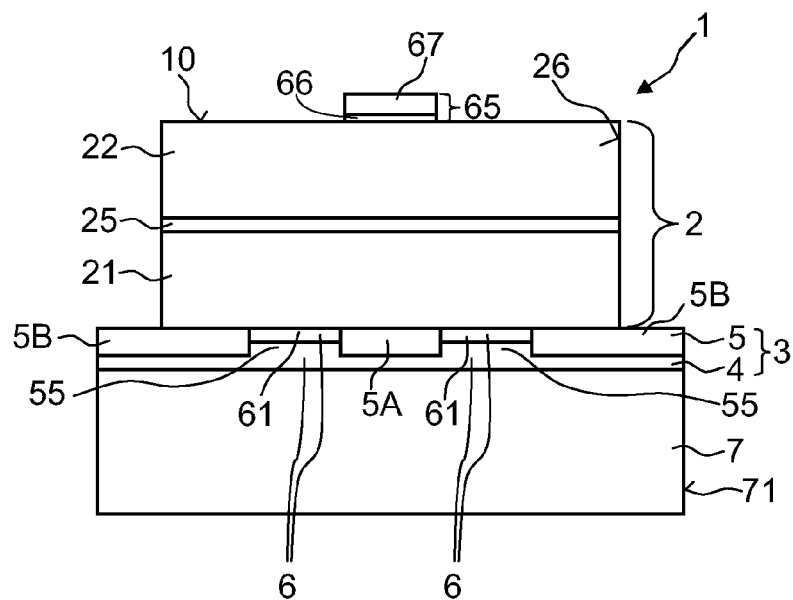
FIGS. 1A and 1B show a first embodiment of a semiconductor chip according to the invention in a schematic sectional view in FIG. 1A and in a schematic plan view in FIG. 1B, FIG. 2, illustrates a second embodiment of a semiconductor chip according to the invention in a schematic sectional view.
Figure 1B:
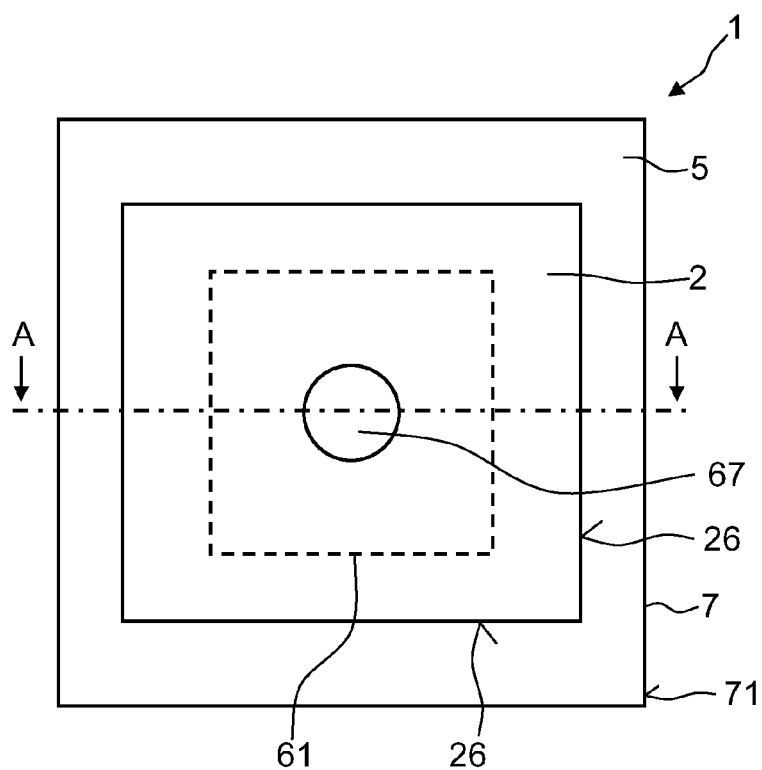

A first embodiment of a semiconductor chip according to the invention is shown in a schematic sectional view in FIG. 1A along the section line A-A shown in the associated plan view (FIG. 1B).

Semiconductor chip 1 comprises a semiconductor layer sequence that forms the semiconductor body 2. The semiconductor layer sequence is preferably deposited epitaxially on a growth substrate, for example, by means of MOVPE or MBE. The semiconductor layer sequence of semiconductor body 2 includes an active region 25. The active region is arranged between a p-type layer 21 and an n-type layer 22 of the semiconductor layer sequence. A mirror structure 3 that includes a mirror layer 4 and a dielectric layer structure 5 is arranged on the semiconductor body. The p-type layer 21 is formed, for example, on the side of the active region facing the mirror structure. Correspondingly, n-type layer 22 is formed on the side of active region 25 facing away from mirror structure 3. Deviating from this, an arrangement is also possible in which the n-type and the p-type layers are reversed.

Semiconductor chip 1 includes a carrier 7, on which the semiconductor body 2 is arranged. In particular, the carrier is different from a growth substrate for the semiconductor layer sequence of the semiconductor body 2. It, therefore, need not meet the demands placed on the growth substrate, particularly with regard to crystalline purity. Instead the carrier may be chosen according to other properties, such as a high mechanical stability or a high thermal conductivity. Semiconductor body 2 may be mounted, for example, by means of a connecting layer on the carrier (not explicitly shown). The connecting layer may be, for example, a solder or an adhesive, preferably electrically conductive. For example, the carrier may contain a semiconductor such as silicon, silicon carbide, gallium arsenide, gallium nitride or germanium, or consist of such a material. The carrier may be configured to be electrically conductive. In this case, the semiconductor chip may be externally contacted through the carrier material. An electrically insulating carrier, such as a carrier containing sapphire or AlN, or consisting of such a material, may also be used.

Alternatively to mounting the semiconductor body 2 on a prefabricated carrier body, the carrier 7 may be deposited onto semiconductor body 2. The carrier here is preferably deposited sufficiently thickly to mechanically stabilize semiconductor body 2 with the semiconductor layer sequence. In this case, a connecting layer between the semiconductor body 2 and the carrier 7 may be dispensed with. Such a carrier formed on semiconductor body 2 with the semiconductor layer sequence may be produced, for example, by means of galvanizing, sputtering or vapor deposition.

In a plan view onto the semiconductor chip 1, the carrier 7 has a greater lateral extent than the semiconductor body 2. The semiconductor body 2 thus covers the carrier only in regions.

The dielectric layer structure 5 preferably contains an oxide such as $SiO_2$, a nitride such as $Si_3N_4$, or an oxynitride such as SiON.

The mirror structure 3 is arranged between the carrier 7 and the semiconductor body 2 with the semiconductor layer sequence. The dielectric layer structure 5 and the mirror layer 4 are thus arranged on the side of the semiconductor body 2 facing the carrier 7. A radiation exit surface 10 of the semiconductor chip is arranged on the opposite side of the semiconductor body than is the carrier. The dielectric layer structure is arranged, at least in a region, between the semiconductor body 2 and the mirror layer 4.

Further, a contact structure 6 is arranged between the semiconductor body 2 and the carrier 7. The contact structure 6 and the dielectric layer structure 5 are arranged alongside one another. The dielectric layer structure has a cutout 55 in which the contact structure 6 is formed. The contact structure 6 extends through the cutout 55.

The dielectric layer structure 5 has an inner subregion 5A and an outer subregion 5B. The outer subregion runs around the inner subregion laterally, the inner subregion and the outer subregion being separated from one another by means of the cutout 55. The cutout thus runs between the inner subregion and the outer subregion. The outer subregion 5B is formed like a frame and, in a plan view onto the semiconductor chip, runs along a lateral boundary of semiconductor body 2. The injection of charge carriers close to the lateral boundary of the semiconductor body during operation of the semiconductor chip 1 may be reduced by means of the outer subregion 5B of the dielectric layer structure 5. Non-radiating recombination of charge carriers at the periphery, for example, at the side face 26, may be prevented in this way. Thereby the overall radiation power exiting from semiconductor chip 1 may be increased.

The contact structure 6 is formed by means of the mirror layer 4 and a reflector layer 61. The reflector layer 61 is formed on the side of the mirror layer facing the semiconductor body. The reflector layer is thus closer to semiconductor body 2 than is the mirror layer. Further, the reflector layer adjoins the semiconductor body. Radiation generated in the active region 25 may be reflected at this reflector layer back into the semiconductor body and subsequently exit from semiconductor chip 1, in particular, via the radiation exit surface 10. In addition, radiation emitted in the direction of carrier 7, particularly in the peripheral areas of semiconductor body 2, may be reflected by the mirror structure 3, in particular, by mirror layer 4. Absorption of radiation in the carrier may in this way be avoided, or at least sharply reduced.

A further contact structure 65 is formed on the side of semiconductor body 2 facing away from carrier 7. The further contact structure includes a further reflector layer 66 and a connection layer 67. The further reflector layer is arranged between the connection layer 67 and the semiconductor body 2. By means of the further reflector layer 66, an absorption of radiation in the connection layer 67 may be prevented. The further contact structure 65, particularly the connection layer 67, is provided for external electrical contacting of the semiconductor chip, for example, by means of a bond wire. The mirror layer preferably contains a metal or a metal alloy, especially preferably gold.

In a plan view onto the semiconductor chip, the further contact structure 65 and inner subregion 5A of the dielectric layer structure 5 cover one another, more particularly mutually. With respect to its lateral shaping, the inner subregion of the dielectric layer structure is thus matched to the shape of further contact structure 65. In this way, the impression of charge carriers into the semiconductor body 2 in operation of the semiconductor chip is guided by means of the dielectric layer structure 5 in such a manner that radiation is generated in the active region 25 predominantly in lateral areas, in which radiation exit surface 10 is not shaded by the further contact structure 65.

The mirror layer preferably contains a metal or a metal alloy, or consists of such a material. The mirror layer particularly preferably contains palladium, platinum, nickel, gold, silver, aluminum, rhodium, titanium, or an alloy with at least one of these materials. For instance, gold is distinguished by a high reflectivity in the infrared. Palladium, aluminum, silver and rhodium, as well as metallic alloys with at least one of these materials, are particularly suitable for the visible and the ultraviolet spectral ranges. The reflectivity of the mirror structure 3 for radiation generated in the active region is preferably 80% or more, especially preferably 90% or more, for example, 95% or more.

The materials listed in connection with the mirror layer 4 are also suitable for the reflector layer 61 and optionally for the further reflector layer 66. Further, the contact structure 6 and the further contact structure 65 may contain at least one layer that contains a TCO material, such as ITO or SnO or one of the other above-mentioned TCO materials.

The reflector layer 61 or the further reflector layer 66 further preferably has, in addition to a high reflectivity for radiation generated in the active region, good electrical contact properties with the semiconductor body 2 as well.

The reflector layer 61 and/or the further reflector layer 66 is preferably thin in comparison to other layers of the contact structure 6 or the further contact structure 65.

Further, the reflector layer 61 and/or the further reflector layer 66 is preferably thin in comparison to the mirror layer 4. The thickness of reflector layer 61 is preferably at most about 200 nm, especially preferably at most about 100 nm.

Further, the reflector layer and/or the further reflector layer may be constructed so thinly that the thickness is at most about 50 nm, preferably at most about 20 nm. The reflector layer and/or the further reflector layer that is constructed this thinly may be partially transparent for radiation generated in the active region 25.

The mirror structure 3, particularly the dielectric layer structure 5, extends in the lateral direction beyond the side face 26, which bounds the semiconductor body 2. The side face 26 in this case is substantially free of material for the dielectric layer structure. In a plan view onto the semiconductor chip, the lateral boundary of the semiconductor body runs inside the dielectric layer structure 5, in particular inside the outer subregion 5B of the dielectric layer structure. In the operation of the semiconductor chip, an injection of charge carriers into the semiconductor body in the peripheral region of the semiconductor body may be prevented in this way. The peripheral region of the semiconductor body is thus not electrically active, or is only active to a slight extent, in comparative terms. By means of the mirror structure 3, radiation that exits from the peripheral region of the semiconductor body 2 may simultaneously be reflected from the mirror structure. Absorption in the carrier of radiation emitted in the direction of carrier 7 may be avoided, or at least sharply reduced, in this way.

In addition, the mirror structure 3, i.e., the dielectric layer structure 5 and the mirror layer 4, extends laterally circumferentially up to a side face 71 bounding carrier 7 in the lateral direction. In this way, an absorption in carrier 7 of radiation generated in the active region that is emitted from the side face 26 of the semiconductor body in the direction of the carrier 7 of the semiconductor body may also be prevented particularly efficiently.

It goes without saying that the contact structure 6 and, optionally, the further contact structure 65 are not limited to the explicitly described embodiment, particularly with respect to their geometric shaping. Instead, the contact structure and the further contact structure may include, for example, one or a plurality of ridge-shaped subregions that may extend, for instance, over the radiation exit surface 10 for efficient impression of charge carriers into the semiconductor body 2. Alternatively or additionally, the contact structure and/or the further contact structure may also include several separate subregions (not explicitly shown in each case).

Deviating from the embodiment shown in FIGS. 1A and 1B, the dielectric layer structure may also have a number of cutouts. For example, the dielectric layer structure, corresponding in particular to the ridge-shaped subregions of the further contact structure, may have ridge-shaped subregions. The dielectric layer structure may be configured here as a laterally contiguous layer structure.

The semiconductor chip 1 is configured as an LED thin-film semiconductor chip. A growth substrate for the semiconductor layer sequence of the semiconductor body 2 is completely removed. The overall height of semiconductor chip 1 may thus be reduced.

Active region 25 is preferably provided for generating radiation in the infrared, visible or ultraviolet spectral range, and especially preferably contains a III-V semiconductor material. III-V semiconductor materials are particularly suited for generating radiation in the ultraviolet ($In_xGa_yAl_{1-x-y}N$), through the visible ($In_xGa_yAl_{1-x-y}N$, particularly for blue to green radiation, or $In_xGa_yAl_{1-x-y}P$, particularly for yellow to red radiation), and into the infrared ($In_xGa_yAl_{1-x-y}As$) spectral ranges.

Deviating from the embodiment shown, semiconductor chip 1 may also be configured as an RCLED semiconductor chip or as a semiconductor laser chip such as a VCSEL or VECSEL, as described in detail above.

Figure 2:
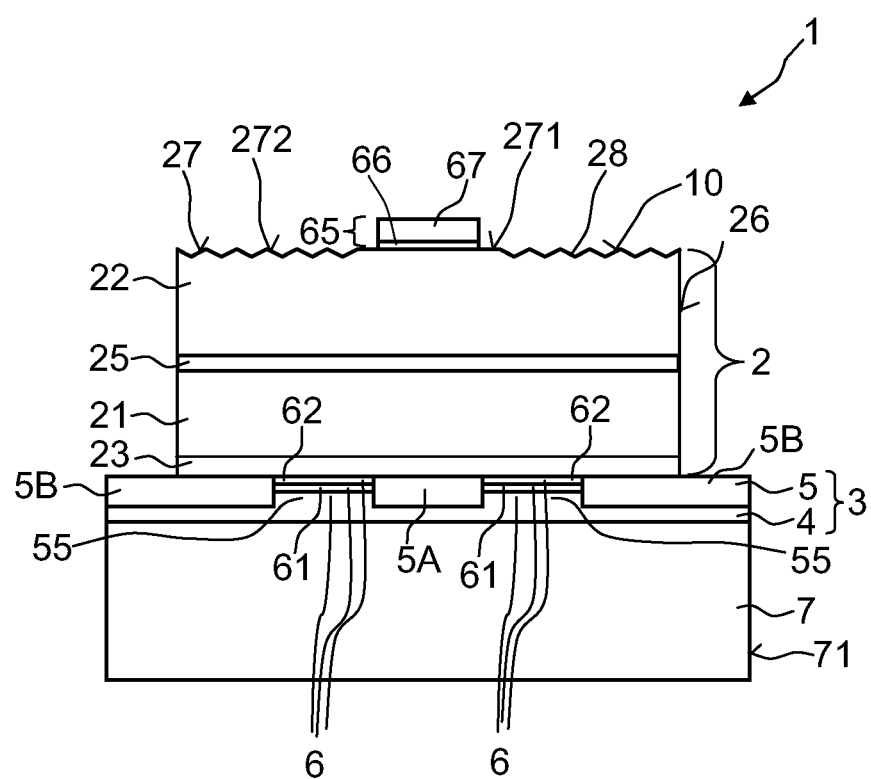

In FIG. 2, a second exemplary embodiment for a semiconductor chip according to the invention, is shown schematically in a sectional view. Here, the second embodiment largely corresponds to the first embodiment described in connection with FIGS. 1A and 1B. It differs in that semiconductor body 2 has a surface 27 with a structuring 28. The surface 27 constitutes the radiation exit surface 10 of semiconductor chip 1.

In addition, surface 27 is preferably constructed flat in a region 271 adjoining further contact structure 65 in the vertical direction. In particular, this region 271 may be smoothed. In that manner, the reflectivity of the further contact structure 65, particularly the further reflector layer 66, may be increased.

The structuring 28 is formed in a further region 272 of the surface 27 that laterally adjoins the region 271 provided for the contact structure. The structuring is preferably configured so as to increase the outcoupling efficiency of radiation from semiconductor chip 1 that is generated in the active region 25.

The structuring 28 may be regularly or irregularly formed. An irregular structuring may be produced mechanically, for example, by roughening.

A regular structuring 28 of surface 27 may be constructed, for example, by means of elevations and recesses, possibly in the form of microprisms or in the form of a photonic lattice.

In a photonic lattice, the period length of the lateral structuring is in the region of the wavelength of the radiation produced in the active region, preferably between 0.1 times and 10 times this wavelength in the material in which the photonic lattice is formed.

Contact structure 6 further includes a layer 62 that contains a TCO material or consists of a TCO material. ITO or SnO is suitable, for example. A binary or ternary TCO material may also be used. The layer 62 containing TCO material is produced between semiconductor body 2 and reflector layer 61. The layer 62 containing TCO material further adjoins semiconductor body 2.

On the side facing contact structure 6, semiconductor body 2 has a tunnel contact layer 23. The tunnel contact layer has a high dopant concentration, preferably at least $10^{18}$ cm$^{-3}$, especially preferably at least $10^{19}$ cm$^{-3}$. The tunnel contact layer is n-type and is thus of the opposite conductivity type from semiconductor layer 21, which is p-doped, that adjoins tunnel contact layer 23. Correspondingly, the tunnel contact layer is p-doped in the case when it adjoins an n-type semiconductor layer.

Charge carriers may be injected into the semiconductor body 2 in a simplified manner by means of the tunnel contact layer 23. In the case, described for the sake of example, of a p-type semiconductor layer 21 to be contacted electrically, the tunnel contact layer 23 is used particularly if the layer of the contact structure 6 that adjoins the semiconductor body 2, i.e., the layer 62 containing TCO material, produces a better electrical contact to an n-type semiconductor layer than to a p-type semiconductor layer. Depending on the material of the contact structure 6, the tunnel contact layer may also be dispensed with.

Figure 3:
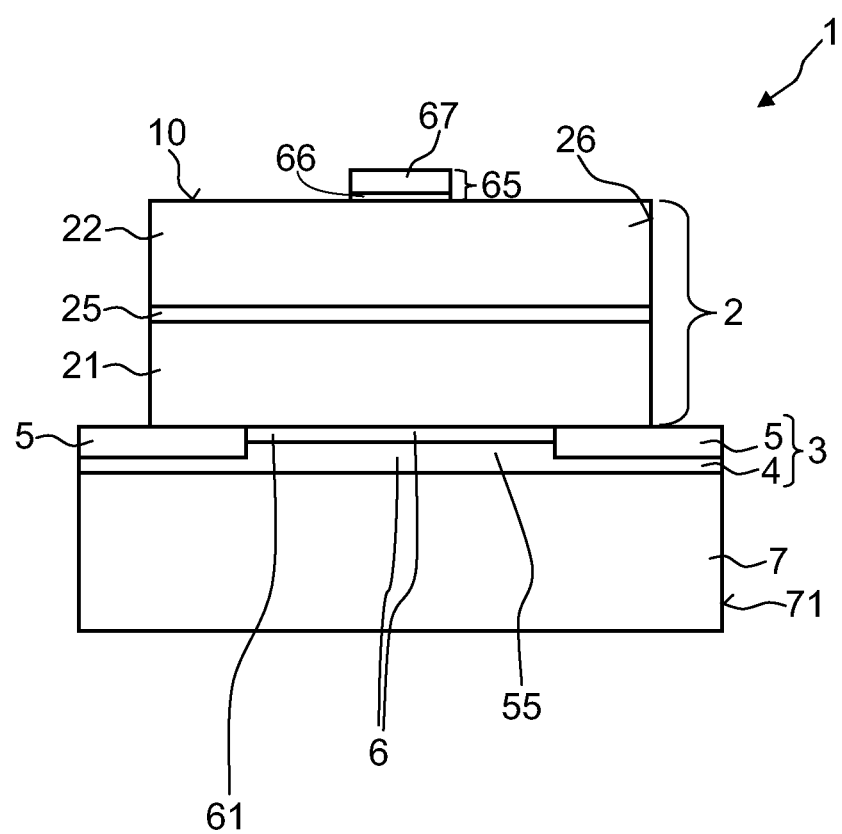
FIG. 3, illustrates a third embodiment of a semiconductor chip according to the invention in a schematic sectional view.

A third exemplary embodiment for a semiconductor chip according to the invention is shown in FIG. 3 in a schematic sectional view. The third embodiment substantially corresponds to the first embodiment described in connection with FIGS. 1A and 1B.

Unlike the first embodiment, the dielectric layer structure 5 is constructed in the shape of a frame. An inner subregion that is spaced away from an outer subregion is, therefore, not provided. Furthermore, the dielectric layer structure has a cutout 55, as was described in connection with the first embodiment. The dielectric layer structure 5 may be constructed as a laterally contiguous layer structure. In addition, the dielectric layer structure 5, like outer subregion 5B of dielectric layer structure 5 of the first embodiment described in connection with FIGS. 1A and 1B, runs predominantly along the lateral boundary of semiconductor body 2 in a plan view onto the semiconductor chip 1. The dielectric layer structure 5 thus serves predominantly to reduce injection of charge carriers into the semiconductor body near the edge, with mirror structure 3, i.e., dielectric layer structure 5 with mirror layer 4, simultaneously having the effect in this peripheral region that an absorption of radiation emitted in the direction of the carrier is avoided or at least reduced in the carrier 7.

As described in connection with the first embodiment, the contact structure 6 is arranged in the cutout 55 of the dielectric layer structure 5.

Figure 4:
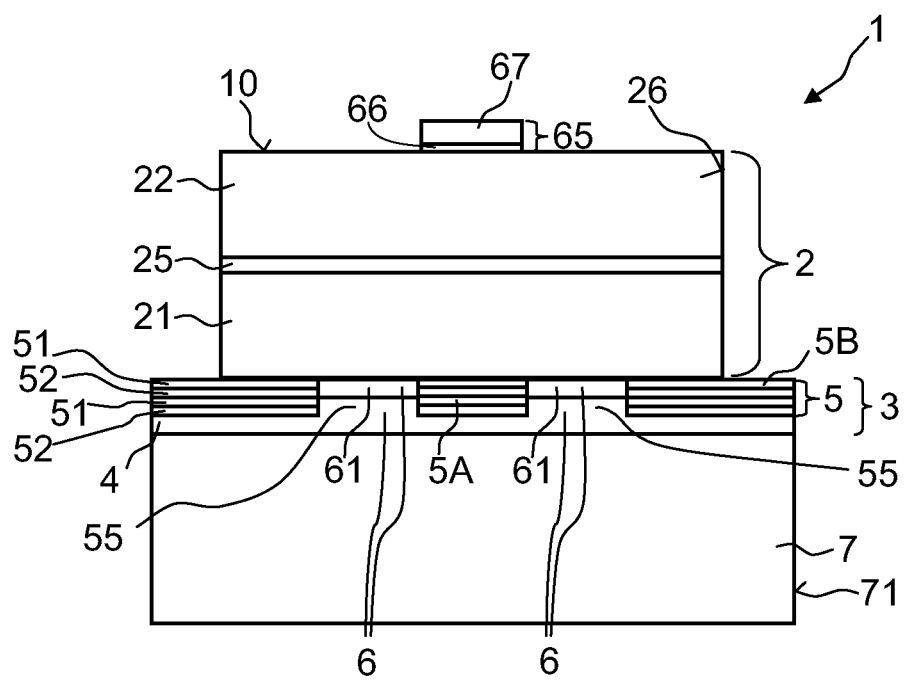
FIG. 4, illustrates a fourth embodiment of a semiconductor chip according to the invention in a schematic sectional view.

A fourth exemplary embodiment for a semiconductor chip according to the invention is shown in FIG. 4 on the basis of a schematic sectional view. The fourth embodiment substantially corresponds to the first embodiment described in connection with FIGS. 1A and 1B. Unlike the first embodiment, dielectric layer structure 5 is constructed with multiple layers. The dielectric layer structure thus includes a plurality of dielectric layers. A dielectric mirror structure may preferably be formed by means of the dielectric layer structure. The dielectric mirror structure includes a plurality of layer pairs, each consisting of a first layer 51 and a second layer 52, wherein the first layer and the second layer have different indices of refraction from one another. The dielectric mirror structure is preferably configured as a Bragg mirror and also preferably has ten layer pairs or more, especially preferably twenty layer pairs or more. The higher the number of layer pairs, the higher the reflectivity of the dielectric mirror structure. Radiation transmitted by dielectric layer structure 5, such as radiation that strikes the layers at a comparatively large angle to the normal of layers 51, 52, may subsequently be reflected back into semiconductor body 2 at mirror layer 4. Due to the combination of the dielectric mirror structure with the mirror layer, it is thus possible for a mirror structure 3 with high reflectivity for radiation generated in the active region to be achieved in a simple manner. In particular, due to the dielectric mirror structure 5 in front of the mirror layer 4, the mirror structure 3 may have a similarly high overall reflectivity even in case of a lower reflectivity of the mirror layer.

A dielectric layer structure 5 configured according to this embodiment with a plurality of layers may of course also be employed in semiconductor chips that are configured in accordance with those embodiments described above or below.

Figure 5:
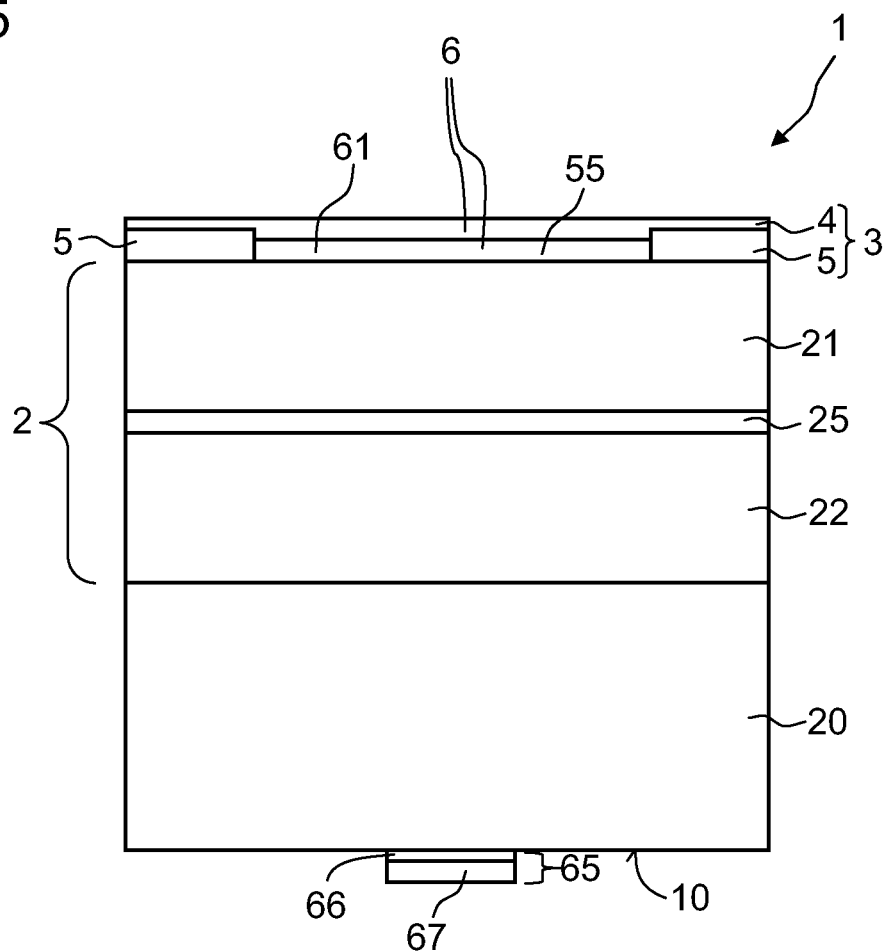
FIG. 5, illustrates a fifth embodiment of a semiconductor chip according to the invention in a schematic sectional view.

In FIG. 5, a fifth exemplary embodiment for a semiconductor chip according to the invention is shown schematically in a sectional view. The fifth embodiment substantially corresponds to the first embodiment described in connection with FIGS. 1A and 1B. Differing therefrom, a growth substrate 20 for the semiconductor layer sequence of semiconductor body 2 is not removed, or at least not completely removed. The growth substrate may, therefore, be thinned. In this case, an additional carrier different from the growth substrate 20 may be dispensed with.

The radiation exit surface 10 of the semiconductor chip is a surface of the growth substrate 20 that faces away from semiconductor body 2. The radiation exit surface here is formed on the side of the active region 25 facing away from the mirror structure 3.

The further contact structure 65 is arranged on the side of growth substrate 20 facing away from semiconductor body 2. In this case, the growth substrate 20 is expediently configured to be electrically conductive. For an electrically nonconductive growth substrate, the further contact structure 65 may alternatively be arranged on the same side of the semiconductor body 2 as the contact structure 6. Such a semiconductor chip is referred to as a flip-chip (not explicitly illustrated). As a further alternative, a growth substrate that is electrically insulating may be removed in regions, so that the semiconductor body 2 is exposed from the side of the growth substrate 20. The further contact structure 65 may then be arranged in this exposed region.

Figure 6:
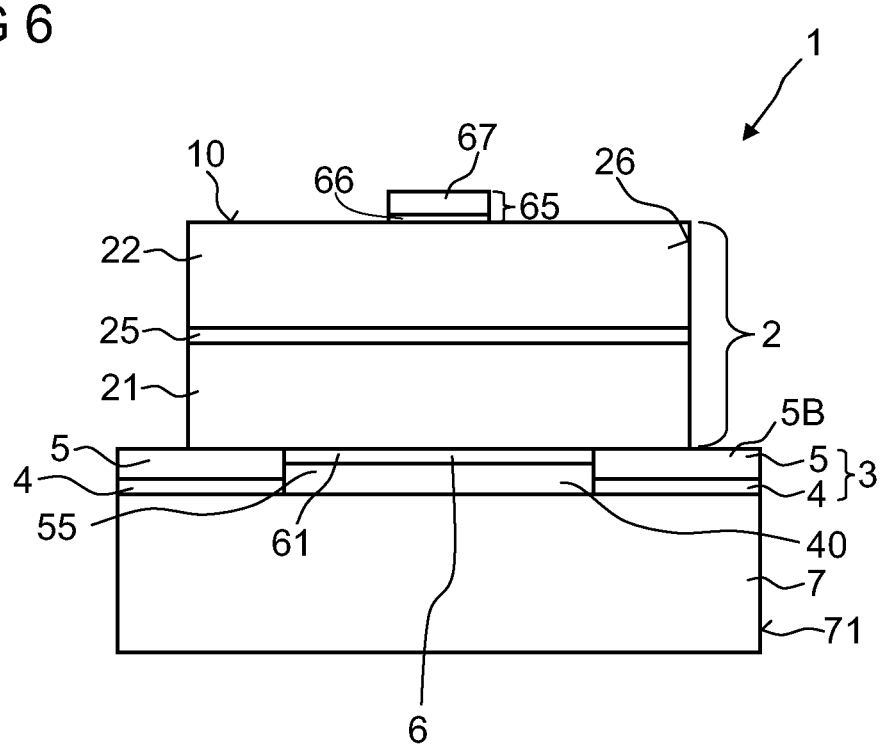
FIG. 6, illustrates a sixth embodiment of a semiconductor chip according to the invention in a schematic sectional view.

In FIG. 6, a sixth embodiment of a semiconductor chip according to the invention is shown schematically in a sectional view. The sixth embodiment substantially corresponds to the third embodiment described in connection with FIG. 3. Differing from the latter, the mirror layer 4 has a cutout 40. The cutout of the mirror layer overlaps the cutout 55 of the dielectric layer structure 5 in a plan view onto the semiconductor chip 1. The dielectric layer structure 5 is arranged continuously between the mirror layer 4 and the semiconductor body 2. The mirror layer 4 is again formed separately from the contact structure 6. In particular, the mirror layer 4 is spaced away from the contact structure 6. In this case, the mirror layer 4 and the contact structure 6 may be optimized largely independently of one another, particularly with respect to the materials used.

An embodiment of a method for manufacturing a semiconductor chip is shown with reference to intermediate steps represented schematically in sectional views in FIGS. 7A-7D. The method is described here only as an example of the manufacturing of a semiconductor chip that is constructed in accordance with the first embodiment. It goes without saying that the method is suitable for manufacturing other semiconductor chips, in particular, for the manufacturing of semiconductor chips in accordance with the second through sixth embodiments.

Figure 7A:
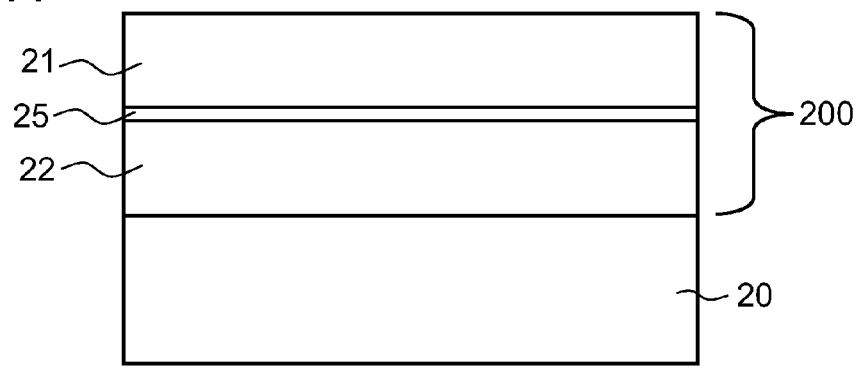
FIGS. 7A through 7D, illustrate an embodiment of a method according to the invention based on intermediate steps schematically illustrated in sectional views.
Figure 7B:
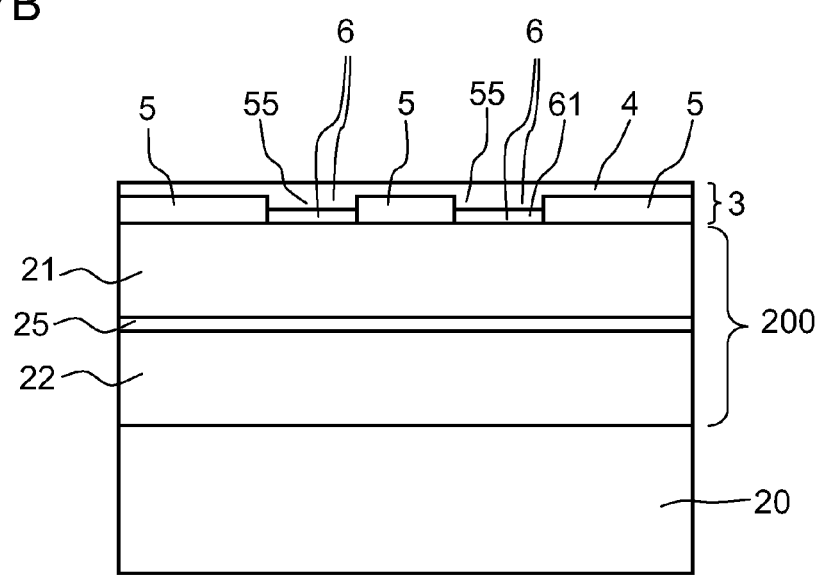

As illustrated in FIG. 7A, a semiconductor layer structure system 200 with an active region 25 is first provided. For the sake of a simplified representation, only the section of the semiconductor layer structure system from which the semiconductor body of the semiconductor chip emerges is shown in the figure.

Semiconductor layer structure system 200 is preferably deposited by means of an epitaxtial method such as MOCVD or MBE on a growth substrate 20 for the semiconductor layer structure system. The semiconductor layer structure system may be provided on this growth substrate 20. Differing from the above, however, the semiconductor layer structure system may also be provided on an auxiliary carrier that is different from the growth substrate.

A mirror structure 3 is formed on the side of semiconductor layer structure system 200 facing away from the growth substrate 20. For this purpose, a dielectric layer structure 5 is deposited on the semiconductor layer structure system 200. Then a mirror layer 4 is deposited on the semiconductor layer structure system 200. The mirror layer 4 is preferably structured laterally in such a manner that the mirror layer covers the dielectric layer structure 5 completely or only in regions. Dielectric layer structure 5 and mirror layer 4 are preferably deposited by means of vapor deposition or sputtering.

Further, a contact structure 6 is formed on the side of semiconductor layer structure system 200 facing away from growth substrate 20. In particular, the contact structure is formed in a cutout 55 of the dielectric layer structure 5. The contact structure is formed by means of a reflector layer 61 and the mirror layer 4. The reflector layer may be deposited before or after the deposition of the dielectric layer structure on the semiconductor layer structure system 200 (see FIG. 7B).

Figure 7C:
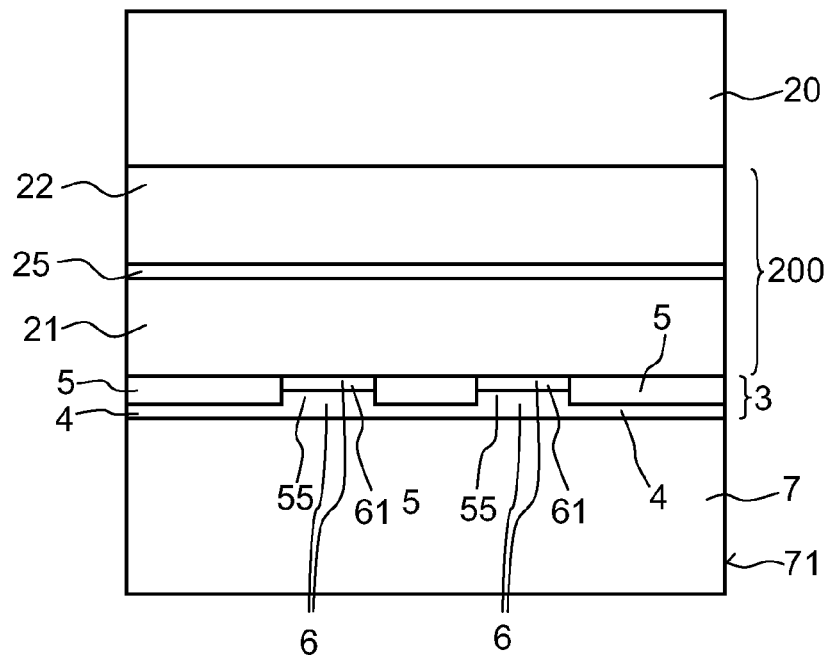

As illustrated in FIG. 7C, semiconductor layer structure system 200 is arranged on a carrier 7 in such a manner that the mirror structure 3 is situated between the semiconductor layer structure system 200 and the carrier 7. A mechanically stable mounting of the semiconductor layer structure system on the carrier may be produced by means of gluing or soldering. The resulting connection layer between carrier 7 and semiconductor layer structure system 200 is not explicitly illustrated. It is furthermore preferred that the semiconductor layer structure system is mounted on the carrier in a wafer-bonding process.

Differing from that, the carrier 7 may also be deposited on the semiconductor layer structure system 200 as a layer, preferably a metallic one. For example, a galvanization process or a different deposition method such as vapor deposition or sputtering is suitable for this purpose.

Figure 7D:
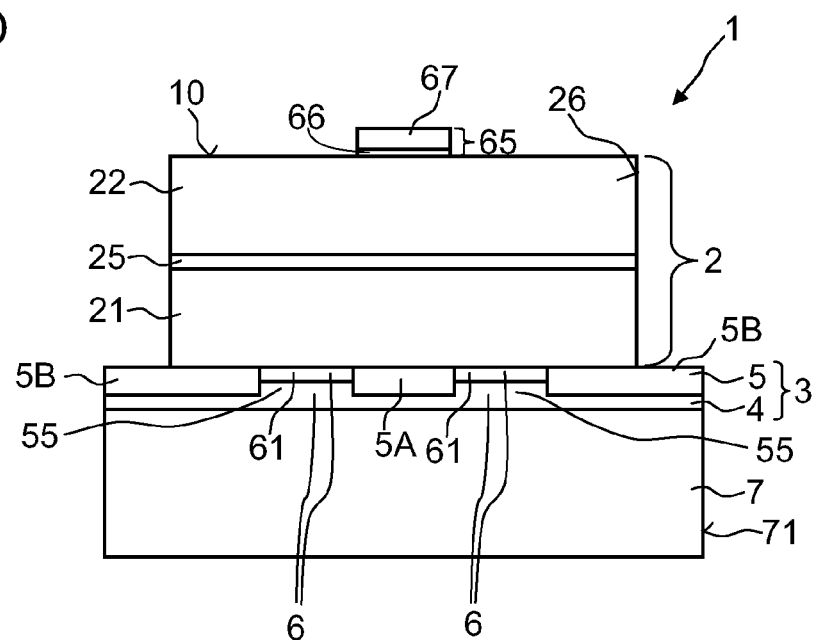

Subsequently, the growth substrate 20 may be removed, as shown in FIG. 7D. The growth substrate may be removed completely or only in regions. Deviating therefrom, the growth substrate may also be thinned completely or in regions. A mechanical process such as grinding, polishing or lapping, or a chemical process such as wet chemical etching or dry chemical etching, for example, is suitable for the removal or thinning of the growth substrate. Alternatively or additionally, the carrier may be removed by means of a laser detachment method.

The semiconductor body 2 is formed from the semiconductor layer structure system 200. The semiconductor body 2 is preferably formed by means of removing material from the semiconductor layer structure system 200. This may be done, for example, by means of wet chemical etching or dry chemical etching. Semiconductor body 2 is preferably formed from semiconductor layer structure system 200 after the growth substrate has been removed or thinned.

The semiconductor material of semiconductor layer structure system 200 is removed from the side of the semiconductor layer structure system that faces away from the carrier 7. Due to the removal of the epitaxial semiconductor material of semiconductor layer structure system 200, the mirror structure 3, in particular, the dielectric layer structure 5, is exposed in regions. Deviating from this, the mirror structure may also be completely cut through. In this case, the removal of material may be continued until carrier 7 is exposed in regions.

To finish the semiconductor chip 1, a further contact structure 65 is formed on a side of the semiconductor body 2 facing away from the mirror structure 3. The further contact structure is preferably formed after the formation of semiconductor body 2 from the semiconductor layer structure system 200.

Preferably, a plurality of semiconductor chips 1 is formed in the method, in particular simultaneously, wherein the semiconductor bodies 2 of the respective semiconductor chips each arise from subregions of semiconductor layer structure system 200 arranged alongside one another.

The invention is not limited to the description with reference to embodiments. Rather, the invention includes every novel characteristic as well as every combination of characteristics, which includes, in particular, every combination of characteristics in the claims, even if this characteristic or this combination itself is not explicitly specified in the claims or the embodiments.

The invention claimed is:

1. A semiconductor chip comprising:
a semiconductor body comprising a semiconductor layer sequence with an active region provided for generating radiation;
a mirror structure arranged on the semiconductor body, the mirror structure comprising a mirror layer and a dielectric layer structure arranged at least in regions between the mirror layer and the semiconductor body, wherein the dielectric layer structure has at least one cutout; and
a contact structure arranged in the at least one cutout of the dielectric layer structure, wherein the contact structure comprises a reflector layer that contains a metal or a metallic alloy and is arranged closer to the semiconductor body than the mirror layer, and wherein the contact structure comprises a layer containing a transparent conductive oxide material, said layer containing transparent conductive oxide material being arranged in the at least one cutout between the semiconductor body and the reflector layer, wherein the transparent oxide material and the reflector layer are arranged only in the at least one cutout.

2. The semiconductor chip according to claim 1, wherein the dielectric layer structure comprises a plurality of dielectric layers forming a dielectric mirror structure.

3. The semiconductor chip according to claim 1 wherein the semiconductor body has a side face that bounds the semiconductor body in a lateral direction and wherein the dielectric layer structure extends in the lateral direction at least in regions beyond the side face that bounds semiconductor body.

4. The semiconductor chip according to claim 1, wherein the dielectric layer structure is divided into at least two separate subregions by means of the at least one cutout.

5. The semiconductor chip according to claim 1, wherein the contact structure is formed with multiple layers.

6. The semiconductor chip according to claim 1, further comprising a further contact structure arranged on a surface of the semiconductor body, on a side of the active region facing away from the contact structure, wherein the surface is flat in a region laterally adjoining the further contact structure, the surface having a structuring in a further region adjoining the flat region of the surface.

7. The semiconductor chip according to claim 1, wherein the semiconductor chip comprises a carrier, wherein the dielectric layer structure is arranged between the semiconductor body and the carrier.

8. The semiconductor chip according to claim 1, wherein the semiconductor chip comprises a carrier, the semiconductor body being arranged on the carrier, and wherein the dielectric layer structure
comprises a plurality of dielectric layers,
is arranged between the carrier and the semiconductor body,
extends in a lateral direction at least in regions beyond a side face of the semiconductor body that bounds the semiconductor body in the lateral direction,
comprises a cutout; and
is divided into at least two separate subregions by means of the cutout.

9. The semiconductor chip according to claim 2, wherein the dielectric mirror structure is divided by means of the at least one cutout into an inner subregion and an outer subregion, wherein
the contact structure that is arranged in the at least one cutout of the dielectric layer structure is arranged on the semiconductor body,
a further contact structure is arranged on the semiconductor body on a side of the active region facing away from the contact structure, and
the inner subregion overlaps the further contact structure in a plan view onto the semiconductor chip.

10. The semiconductor chip according to claim 1, wherein the semiconductor chip is embodied as an LED chip, or as a semiconductor laser chip.

11. A method for manufacturing a semiconductor chip the method comprising:
providing a semiconductor layer structure system with an active region provided for generating radiation;
forming a mirror structure over the semiconductor layer structure system, wherein the mirror structure comprises a dielectric layer structure and a mirror layer, wherein the dielectric layer structure has a at least one cutout;
forming a semiconductor body with a layer sequence from the semiconductor layer structure system; and forming a contact structure in the at least one cutout of the dielectric layer structure, wherein the contact structure comprises a reflector layer that contains a metal or a metallic alloy and is arranged closer to the semiconductor body than the mirror layer, and wherein the contact structure comprises a layer containing a transparent conductive oxide material, said transparent conductive oxide material-containing layer being arranged in the at least one cutout between the semiconductor body and the reflector layer, wherein the transparent oxide material and the reflector layer are arranged only in the at least one cutout.

12. The method according to claim 11, further comprising a surface of the semiconductor body chemically and/or mechanically smoothed in a region.

13. The method according to claim 12, wherein the contact structure is formed over the smoothed region.

14. The method according to claim 13, further comprising forming a further contact structure over the semiconductor body.

15. The semiconductor chip according to claim 2, wherein the dielectric mirror structure is divided by means of the at least one cutout into an inner subregion and an outer subregion, wherein
   the contact structure that is arranged in the at least one cutout of the dielectric mirror structure is arranged on the semiconductor body,
   a further contact structure is arranged on the semiconductor body on a side of the active region facing away from the contact structure, and
   the inner subregion overlaps the further contact structure in a plan view onto the semiconductor chip.

16. The semiconductor chip according to claim 1, wherein the dielectric layer structure is in direct contact with the semiconductor body comprising the semiconductor layer sequence and that the layer containing the transparent conductive oxide material is in direct contact with the semiconductor body comprising the semiconductor layer sequence.

17. The semiconductor chip according to claim 2, wherein the dielectric mirror structure is configured as a Bragg mirror.

* * * * *

UNITED STATES PATENT AND TRADEMARK OFFICE
CERTIFICATE OF CORRECTION

PATENT NO.       : 8,526,476 B2                                              Page 1 of 1
APPLICATION NO. : 12/598747
DATED            : September 3, 2013
INVENTOR(S)      : Engl et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 265 days.

Signed and Sealed this

Fifteenth Day of September, 2015

Michelle K. Lee
*Director of the United States Patent and Trademark Office*